(12) United States Patent
Lin

(10) Patent No.: US 12,476,222 B2
(45) Date of Patent: Nov. 18, 2025

(54) FAN-OUT PACKAGE STRUCTURE

(71) Applicant: JCET GROUP CO., LTD., Wuxi (CN)

(72) Inventor: Yaojian Lin, Wuxi (CN)

(73) Assignee: JCET GROUP CO., LTD., Wuxi (CN)

( * ) Notice: Subject to any disclaimer, the term of this patent is extended or adjusted under 35 U.S.C. 154(b) by 540 days.

(21) Appl. No.: 17/919,280

(22) PCT Filed: Apr. 14, 2021

(86) PCT No.: PCT/CN2021/087223
§ 371 (c)(1),
(2) Date: Oct. 16, 2022

(87) PCT Pub. No.: WO2021/208961
PCT Pub. Date: Oct. 21, 2021

(65) Prior Publication Data
US 2023/0178517 A1 Jun. 8, 2023

(30) Foreign Application Priority Data
Apr. 17, 2020 (CN) .......................... 202010305210.7

(51) Int. Cl.
*H01L 25/065* (2023.01)
*H01L 23/00* (2006.01)
*H01L 23/31* (2006.01)

(52) U.S. Cl.
CPC ...... *H01L 25/0655* (2013.01); *H01L 23/3128* (2013.01); *H01L 24/04* (2013.01);
(Continued)

(58) Field of Classification Search
CPC . H01L 25/0655; H01L 25/50; H01L 23/3128; H01L 23/367; H01L 23/49816;
(Continued)

(56) References Cited

U.S. PATENT DOCUMENTS

2009/0152742 A1    6/2009  Ikeguchi et al.
2011/0075451 A1*   3/2011  Bayerer ................. H01L 24/85
                                                     257/692
(Continued)

FOREIGN PATENT DOCUMENTS

CN    103887251 A    6/2014
CN    103904044 A    7/2014
(Continued)

*Primary Examiner* — Marlon T Fletcher
*Assistant Examiner* — Christina A Sylvia
(74) *Attorney, Agent, or Firm* — MUNCY, GEISSLER, OLDS & LOWE, P.C.

(57) ABSTRACT

The present invention discloses a fan-out package structure. The fan-out package structure includes: a redistribution layer, a solder ball disposed below the redistribution layer, a high-heat chip and a low-heat chip that are electrically connected above the redistribution layer, and a plastic package material disposed above the redistribution layer in a filling manner and coating the high-heat chip and the low-heat chip, wherein an upper surface of the high-heat chip is exposed outside the plastic package material, and an upper surface of the low-heat chip is encapsulated in the plastic package material; a warpage adjusting and protective layer is disposed on the upper surface of the low-heat chip, or at least one through hole is formed in the plastic package material right above the low-heat chip and part of the upper surface of the low-heat chip is exposed outside the plastic package material through the through hole.

9 Claims, 5 Drawing Sheets

(52) U.S. Cl.
CPC .............. *H01L 24/12* (2013.01); *H01L 24/19* (2013.01); *H01L 2224/04105* (2013.01); *H01L 2224/12105* (2013.01); *H01L 2224/19* (2013.01); *H01L 2924/3511* (2013.01)

(58) Field of Classification Search
CPC . H01L 23/5383; H01L 23/16; H01L 23/3135; H01L 23/562; H01L 23/3171; H01L 24/04; H01L 24/12; H01L 24/19; H01L 2224/04105; H01L 2224/12105; H01L 2224/19; H01L 21/56; H01L 21/6835; H01L 21/568; H01L 2924/3511; H01L 2221/68345
See application file for complete search history.

(56) References Cited

U.S. PATENT DOCUMENTS

| | | | |
|---|---|---|---|
| 2015/0021754 A1* | 1/2015 | Lin | H01L 23/552 438/122 |
| 2015/0187679 A1* | 7/2015 | Ho | H01L 23/055 438/118 |
| 2017/0221788 A1* | 8/2017 | Yeh | H01L 21/565 |
| 2018/0308788 A1* | 10/2018 | Park | H01L 23/3128 |
| 2019/0103353 A1* | 4/2019 | Liu | H01L 24/32 |

FOREIGN PATENT DOCUMENTS

| | | |
|---|---|---|
| CN | 104966677 A | 10/2015 |
| CN | 105428260 A | 3/2016 |
| CN | 110600438 A | 12/2019 |

\* cited by examiner

FAN-OUT PACKAGE STRUCTURE

CROSS REFERENCE TO RELATED APPLICATIONS

The present invention is a 35 U.S.C. § 371 National Phase conversion of International (PCT) Patent Application No. PCT/CN2021/087223, filed on Apr. 14, 2021, which claims benefit of Chinese Application No. 202010305210.7, filed on Apr. 17, 2020, the disclosure of which is incorporated by reference herein. The PCT International Patent Application was filed and published in Chinese.

TECHNICAL FIELD

The present invention belongs to the field of semiconductor manufacturing, and particularly relates to a fan-out package structure.

BACKGROUND

A redistributed exposed package structure intrinsically has a relatively thick redistribution and underfill/plastic-package bonding layer with a relatively high thermal expansion coefficient on a front surface of a chip. With a requirement of a decreasing fan degree on a thick chip in the package structure, the exposed package structure may be obviously warped, adversely affecting a subsequent flip-chip process and causing problems of process and reliability failures.

SUMMARY

In order to solve the above technical problems, objectives of the present invention are to provide a fan-out package structure.

In order to achieve one of the objectives of the present invention described above, a fan-out package structure is provided according to an embodiment of the present invention. The fan-out package structure includes a redistribution layer, a solder ball disposed below the redistribution layer, a high-heat chip and a low-heat chip that are electrically connected above the redistribution layer, and a plastic package material disposed above the redistribution layer in a filling manner and coating the high-heat chip and the low-heat chip, wherein an upper surface of the high-heat chip is exposed outside the plastic package material, and an upper surface of the low-heat chip is encapsulated in the plastic package material;

a warpage adjusting and protective layer is disposed on the upper surface of the low-heat chip; or at least one through hole is formed in the plastic package material right above the low-heat chip, and part of the upper surface of the low-heat chip is exposed outside the plastic package material through the through hole.

As a further improvement of an embodiment of the present invention, in a case of disposing the warpage adjusting and protective layer on the upper surface of the low-heat chip, an upper surface of the warpage adjusting and protective layer is exposed outside the plastic package material; or the plastic package material extends to the above of the warpage adjusting and protective layer, and coats the upper surface of the warpage adjusting and protective layer.

As a further improvement of an embodiment of the present invention, in a case of forming the through hole in the plastic package material right above the low-heat chip, the fan-out package structure further includes: a warpage adjusting and protective layer disposed on the upper surface of the low-heat chip, the through hole penetrating through the warpage adjusting and protective layer.

As a further improvement of an embodiment of the present invention, a groove is formed downward from the upper surface of the plastic package material where the low-heat chip is close to the high-heat chip, the groove is not connected to the adjacent chip, and a bottom of the groove is not lower than the upper surface of the low-heat chip; and the chip includes a high-heat chip and/or a low-heat chip.

As a further improvement of an embodiment of the present invention, the opening size of the through hole remains unchanged or gradually decreases in an extension direction from the upper surface of the plastic package material to the low-heat chip.

As a further improvement of an embodiment of the present invention, at least one through hole is disposed in a long strip shape along an edge of the low-heat chip close to the high-heat chip, and/or at least two through holes are arranged in a long strip shape along the edge of the low-heat chip close to the high-heat chip.

As a further improvement of an embodiment of the present invention, the high-heat chip and the low-heat chip are both electrically connected to the redistribution layer through the solder ball.

As a further improvement of an embodiment of the present invention, the fan-out package structure further includes an underfill layer coated with the plastic package material and disposed above the redistribution layer in a filling manner, wherein the underfill layer coats ends/an end of sides/a side of the high-heat chip and/or the low-heat chip that are/is close to the redistribution layer.

As a further improvement of an embodiment of the present invention, the underfill layer further coats side walls/a side wall of the high-heat chip and/or the low-heat chip.

As a further improvement of an embodiment of the present invention, the fan-out package structure further includes at least one polymer dielectric layer attached to a lower surface of the low-heat chip.

As a further improvement of an embodiment of the present invention, the warpage adjusting and protective layer has a thickness being greater than or equal to 10 μm and a thermal expansion coefficient being greater than 10 ppm/K.

Compared with the prior art, in the fan-out package structure of the present invention, the warpage adjusting and protective layer is disposed on a back surface of the low-heat chip, or at least one through hole is formed in the plastic package material above the low-heat chip, such that the warpage adjustment capability of the entire fan-out package structure is enhanced, and a yield and stability of the fan-out package structure are both greatly improved.

DETAILED DESCRIPTION

Figure 1:
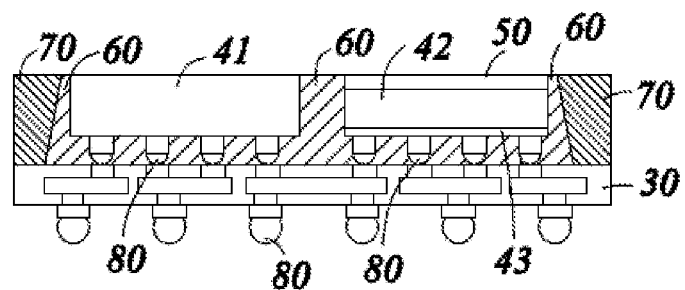
FIG. 1 is a schematic structural diagram of a fan-out package structure according to a first embodiment of the present invention.

The present invention will be described in detail below in combination with specific embodiments shown in the drawings. However, these embodiments do not limit the present invention, and all structural, method or functional variations made by those of ordinary skills in the art according to these embodiments shall be included in the protection scope of the present invention.

It is to be noted that, terms such as "upper" and "lower" indicating relative positions in space used herein are intended to describe a relationship of a unit or feature relative to another unit or feature as shown in the drawings for ease of illustration. The terms indicating relative positions in space may be intended to include different orientations of a package structure in use or operation, in addition to the orientations shown in the drawings. For example, if the device in the drawing is flipped, a unit described as on a "lower surface" of other units or features will be on an "upper surface" of other units or features. Accordingly, the exemplary term "lower surface" may encompass both orientations of the upper surface and the lower surface. The package structure may be oriented in other ways (rotated by 90 degrees or facing other orientations), and the space-related description terms used herein may be correspondingly explained.

As shown in FIGS. 1-5, each of the fan-out package structures according to the embodiments of the present invention includes a redistribution layer 30, solder balls 80 disposed below the redistribution layer 30, a high-heat chip 41 and a low-heat chip 42 that are electrically connected above the redistribution layer 30, and a plastic package material 70 disposed above the redistribution layer 30 in a filling manner and coating the high-heat chip 41 and the low-heat chip 42. An upper surface of the high-heat chip 41 is exposed outside the plastic package material 70, and an upper surface of the low-heat chip 42 is encapsulated in the plastic package material 70.

Generally, the high-heat chip 41 is a system-on-a-chip (SOC), and the low-heat chip 42 is a storage chip.

Specifically, as shown in FIG. 1, the fan-out package structure according to the first embodiment of the present invention further includes: a warpage adjusting and protective layer 50 disposed on the upper surface of the low-heat chip 42, an upper surface of the warpage adjusting and protective layer 50 being exposed outside the plastic package material 70; at least one polymer dielectric layer 43 attached to a lower surface of the low-heat chip 42; and an underfill layer 60 coated with the plastic package material 70 and disposed above the redistribution layer 30 in a filling manner. The underfill layer 60 extends upward from the upper surface of the redistribution layer 30, coats side walls of the high-heat chip 41 and the low-heat chip 42, and extends to be in the same plane as the upper surface of the package structure. In addition, the high-heat chip 41 and the low-heat 42 are both electrically connected to the redistribution layer 30 through the solder balls 80. Generally, the solder ball 80 may be a tin ball or a metal bump with a solder cap, or may also be other types of electrical connectors.

Figure 2:
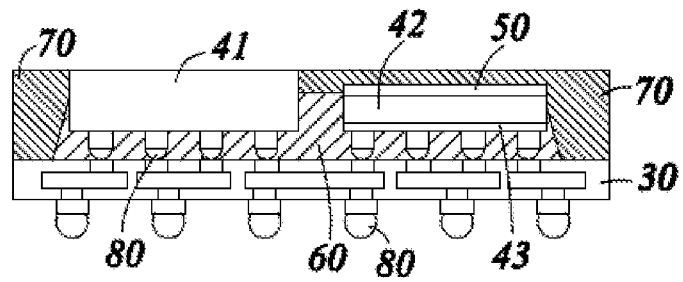
FIG. 2 is a schematic structural diagram of a fan-out package structure according to a second embodiment of the present invention.

As shown in FIG. 2, the fan-out package structure according to the second embodiment of the present invention further includes: a warpage adjusting and protective layer 50 disposed on the upper surface of the low-heat chip 42, the plastic package material 70 extending to the above of the warpage adjusting and protective layer 50 and coating the upper surface of the warpage adjusting and protective layer 50; at least one polymer dielectric layer 43 attached to a lower surface of the low-heat chip 42; and an underfill layer 60 coated with the plastic package material 70 and disposed above the redistribution layer 30 in a filling manner. The underfill layer 60 extends upward from the upper surface of the redistribution layer 30, coats the entire side wall of the high-heat chip 41 and part of the side wall of the low-heat chip 42, and extends to be in the same plane as the upper surface of the low-heat chip 42. In addition, the high-heat chip 41 and the low-heat 42 are both electrically connected to the redistribution layer 30 through the solder balls 80.

Preferably, in any of the above and below embodiments, if the warpage adjusting and protective layer 50 is disposed in the embodiment, the warpage adjusting and protective layer 50 preferably has a thickness being greater than or equal to 10 μm and a thermal expansion coefficient being greater than 10 ppm/K. Further, the thermal expansion coefficient of the warpage adjusting and protective layer 50 being greater than 20 ppm/K may be selected. Generally, the material of the warpage adjusting and protective layer 50 may be selected from epoxy resin, silica gel, polyimide (PI), polybenzoxazole (PBO), benzocyclobutene (BCB), an epoxy resin filling composite material and other polymer composite materials, which are not described in detail herein.

Preferably, in the first embodiment of the present invention, when the warpage adjusting and protective layer 50 is selected, the thermal expansion coefficient is greater than 20 ppm/K.

In the fan-out package structures according to the first embodiment and the second embodiment of the present invention, by disposing the warpage adjusting and protective layer 50 on the upper surface of the low-heat chip 42, the warpage adjustment capability of the entire fan-out package structure is enhanced, and the yield and the stability of the fan-out package structure are both greatly improved.

Figure 3:
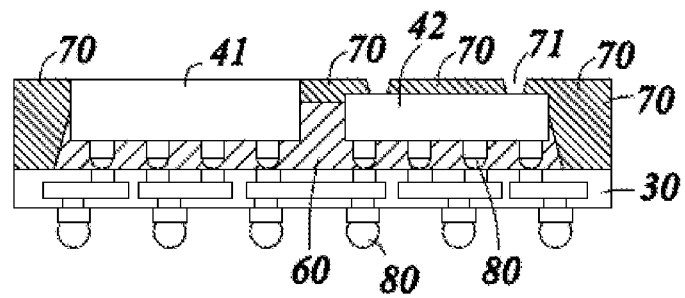
FIG. 3 is a schematic structural diagram of a fan-out package structure according to a third embodiment of the present invention.

As shown in FIG. 3, the fan-out package structure according to the third embodiment of the present invention further includes at least one through hole 71 formed in the plastic package material 70 right above the low-heat chip 42, part of the upper surface of the low-heat chip 42 being exposed outside the plastic package material 70 through the through holes 71; and an underfill layer 60 coated with the plastic package material 70 and disposed above the redistribution layer 30 in a filling manner. The underfill layer 60 extends upward from the upper surface of the redistribution layer 30, and coats part of side walls of the high-heat chip 41 and the low-heat chip 42. In addition, the high-heat chip 41 and the low-heat 42 are both electrically connected to the redistribution layer 30 through the solder balls 80.

Figure 3A:
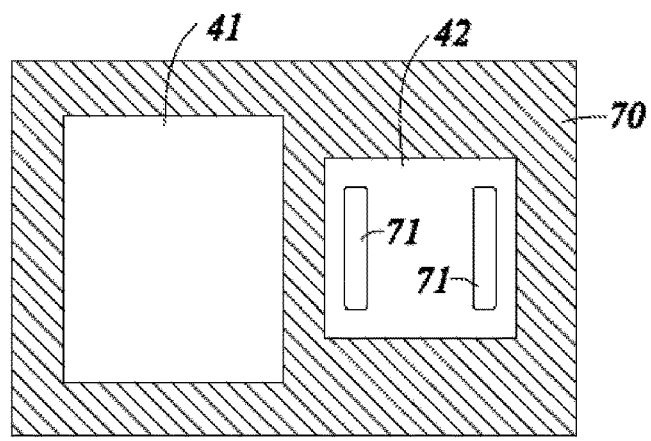
FIG. 3A, FIG. 3B and FIG. 3C are top views of through holes with different structures in the embodiment shown in FIG. 3, respectively.
Figure 3B:
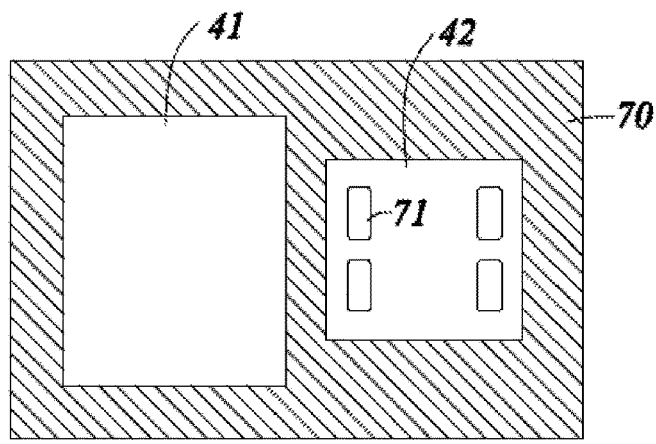
Figure 3C:
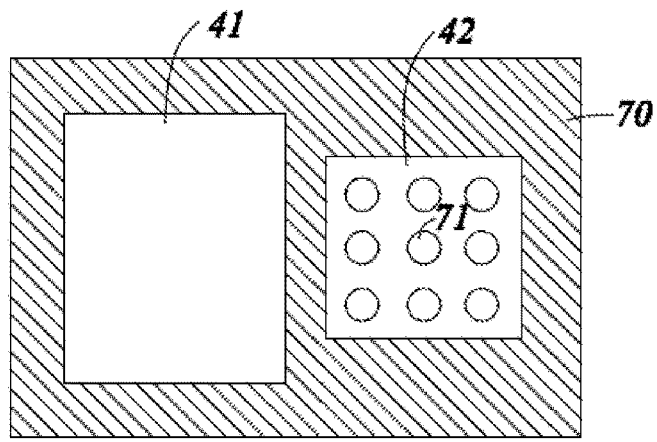

Preferably, as shown in FIG. 3A, FIG. 3B and FIG. 3C, the size, shape, number, proportion relative to each of the chips and arrangement mode of the through hole 71 may be set according to specific requirements. For example, one or more through holes 71 are set; the opening of the through hole 71 is set to a long strip shape, a round shape, a polygonal shape, a racetrack shape or a polygonal shape with arc chamfers. When a plurality of through holes 71 is disposed, the arrangement mode thereof is linear arrangement, staggered arrangement, irregular arrangement avoiding a heat sensitive region of each of the chips, or the like. The opening area is, for example, 0.5% to 99.5% of the area of the low-heat chip 42 below the through hole 71, and the position and size of the opening may be adjusted according to the specific performance of heat dissipation and warpage.

In a preferred embodiment of the present invention, the opening size of the through hole 71 remains unchanged or gradually decreases in an extension direction from the upper surface of the plastic package material 70 to the low-heat chip 42.

In addition, in a preferred embodiment of the present invention, the through hole 71 is disposed to avoid crossing an edge of the low-heat chip 42.

For the disposal of the through hole 71, as shown in FIG. 3A, at least one through hole 71 is disposed in a preferred embodiment of the present invention. Further, the at least one through hole 71 is disposed in a long strip shape along the edge of the low-heat chip 42 close to the high-heat chip 41. In the specific embodiment, preferably, the corner of the through hole 71 is set to an arc chamfer shape. Preferably, the opening width of the through hole 71 on the upper surface of the fan-out package structure is greater than or equal to 50 µm, and a length-width ratio of the through hole 71 is 1:1 to 1:10.

As shown in FIG. 3B and FIG. 3C, at least two through holes 71 are disposed, and arranged in a long strip shape along the edge of the low-heat chip 42 close to the high-heat chip 41. In the embodiment shown in FIG. 3B, a radial section of each through hole 71 is set to a long strip shape. In the embodiment shown in FIG. 3C, a radial section of each through hole 71 is set to a round shape.

Preferably, when a plurality of through holes 71 is disposed, the minimum spacing between adjacent through holes 71 is greater than or equal to 50 µm.

Preferably, the through holes 71 are disposed at the edge of the low-heat chip 42 close to the high-heat chip 41, and the distance of each through hole 71 to the edge of the low-heat chip 42 adjacent to the through hole is greater than or equal to 50 µm.

Preferably, the through holes 71 disposed at the edge of the low-heat chip 42 close to the high-heat chip 41 are generally disposed in the middle, and a straight-line distance between the through holes 71 disposed at the edge close to the high-heat chip 41 is greater than a half of a straight-line distance between each of the through holes 71 and a chip adjacent thereto.

Figure 4:
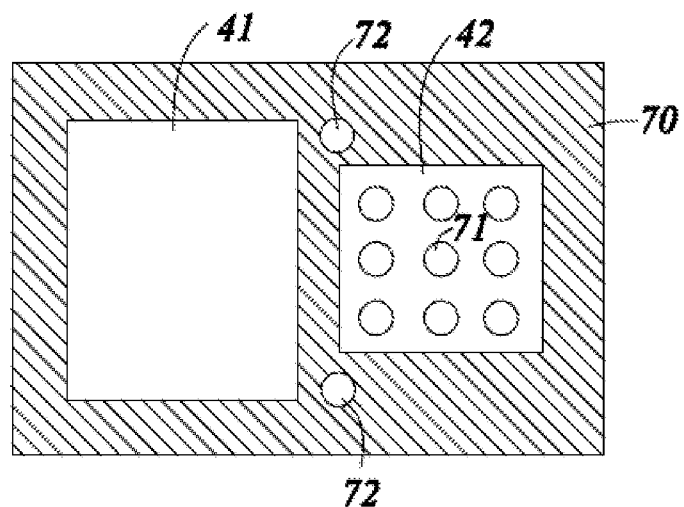
FIG. 4 is a top view of a fan-out package structure according to a fourth embodiment of the present invention.

As shown in FIG. 4, the fan-out package structure according to the fourth embodiment is modified based on the fan-out package structure according to the third embodiment described above, and is different from that of the third embodiment in that, a groove 72 is formed downward from the upper surface of the plastic package material where the low-heat chip 42 is close to the high-heat chip 41; the groove 72 is not connected to the adjacent chip, and the bottom of the groove 72 is not lower than the upper surface of the low-heat chip 42; and the chip includes a high-heat chip 41 and/or a low-heat chip 42. It is to be noted that, the groove 72 in this embodiment is usually formed in the plastic package material close to the low-heat chip 42, and is not connected to any chip in a planar extension direction of the chips.

FIG. 4 is only marked based on FIG. 3C, and other structures are not further described in detail.

Figure 5:
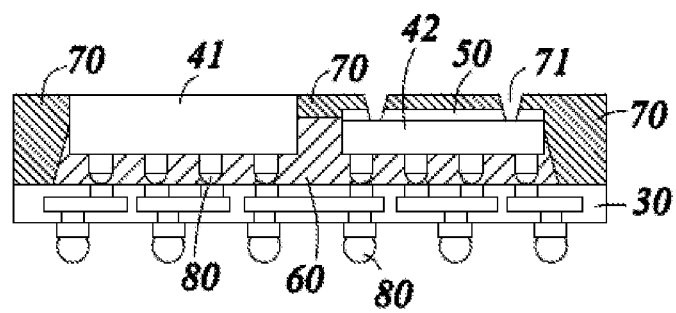
FIG. 5 is a schematic structural diagram of a fan-out package structure according to a fifth embodiment of the present invention.

As shown in FIG. 5, the fan-out package structure according to the fifth embodiment of the present invention is modified based on the fan-out package structure according to the third embodiment or the fourth embodiment described above, and is different from that of the third embodiment or the fourth embodiment in that, the fan-out package structure further includes a warpage adjusting and protective layer 50 disposed on the upper surface of the low-heat chip 42, the through hole 71 penetrating through the warpage adjusting and protective layer 50. The material, thickness and thermal expansion efficient of the warpage adjusting and protective layer 50 of the fifth embodiment may refer to the foregoing embodiments, which are not further described in detail herein.

In the fan-out package structures according to the third embodiment, the fourth embodiment and the fifth embodiment of the present invention, at least one through hole 71 is formed in the plastic package material 70 above the low-heat chip 42, such that a window can be provided to allow the low-heat chip to be in direct contact with a thermal interface material while the warpage adjustment capability of the entire fan-out package structure is enhanced, improving the heat dissipation capability of the chips and the overall stability at the spacing of the chips, and greatly improving the yield and the stability of the fan-out package structure.

It is to be noted that, in other embodiments of the present invention, the manners in which the high-heat chip 41 and the low-heat chip 42 are electrically connected to the redistribution layer 30 may all be adjusted correspondingly according to the prior art, based on any of the above embodiments. That is, the high-heat chip 41 and the low-heat chip 42 may be in direct or indirect electrical connection with the redistribution layer 30 through the solder balls 80 as shown in the above drawings, or connected by a solder wire, or the like, which is not enumerated in detail herein. In addition, in each of the above embodiments, at least one polymer dielectric layer 43 disposed on the lower surface of the low-heat chip 42 may be selectively added or removed. In each of the above embodiments, the underfill layer 60 around the chips in a coating manner may selectively coat any chip or may not coat any chip, may extend upward from the redistribution layer 30 to only coat the solder balls 80 or the like below the chips, or may extend upward from the redistribution layer 30 to coat till lower ends of the chips, or may coat side walls of the chips by extending upward to a position flush with the upper surfaces of the chips from the redistribution layer 30.

Figure 6:
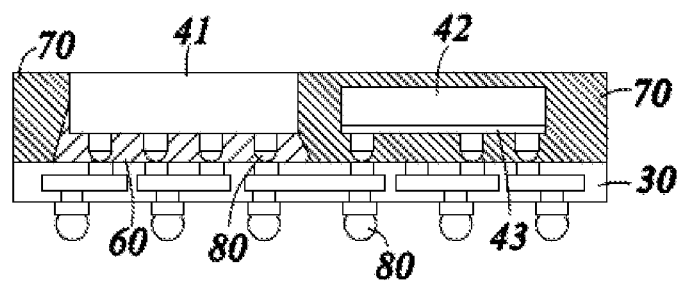
FIG. 6 is a schematic structural diagram of a fan-out package structure according to a sixth embodiment of the present invention.

As shown in FIG. 6, the fan-out package structure according to the sixth embodiment of the present invention includes a redistribution layer 30, solder balls 80 disposed below the redistribution layer 30, a high-heat chip 41 and a low-heat chip 42 that are electrically connected above the redistribution layer 30, at least one polymer dielectric layer 43 attached to a lower surface of the low-heat chip 42, and a plastic package material 70 disposed above the redistribution layer 30 in a filling manner and coating the high-heat chip 41 and the low-heat chip 42. An upper surface of the high-heat chip 41 is exposed outside the plastic package material 70, and an upper surface of the low-heat chip 42 is encapsulated in the plastic package material 70. The fan-out package structure further includes an underfill layer 60 coated with the plastic package material 70 and disposed above the redistribution layer 30 in a filling manner. The underfill layer 60 extends upward from the upper surface of the redistribution layer 30, and only coats a lower end of the high-heat chip 41 and/or a portion of the high-density solder balls.

In addition, in the sixth embodiment, the high-heat chip 41 and the low-heat chip 42 are both electrically connected to the redistribution layer 30 through the solder balls 80. Generally, each solder ball 80 may be a tin ball or a metal bump with a solder cap, or may also be other types of electrical connectors. The polymer dielectric layer 43 may be selectively added or removed, which is not described in further detail herein.

Figure 7:
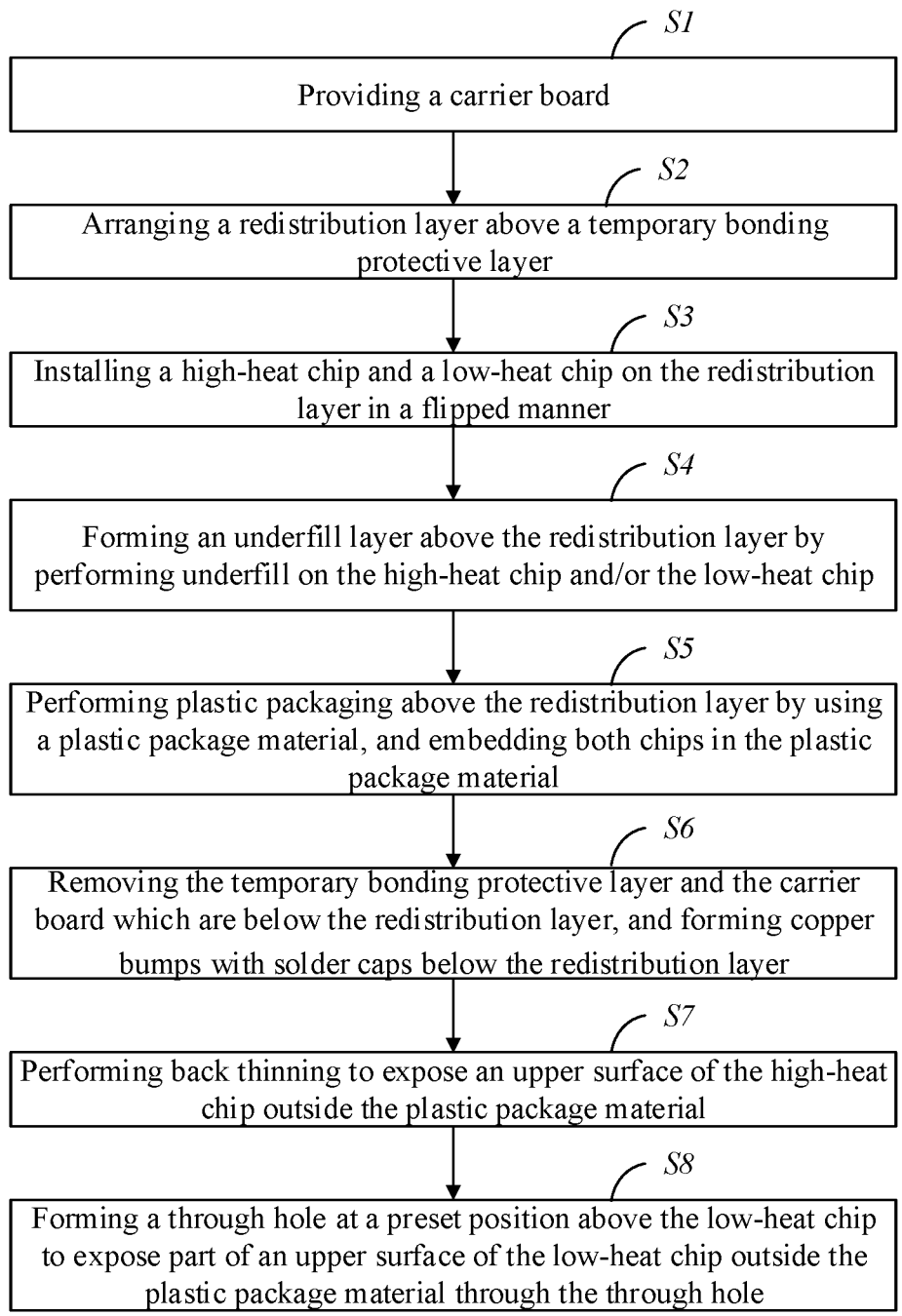
FIG. 7 is a flowchart of a package method of the fan-out package structure according to the fifth embodiment of the present invention.
Figure 8:
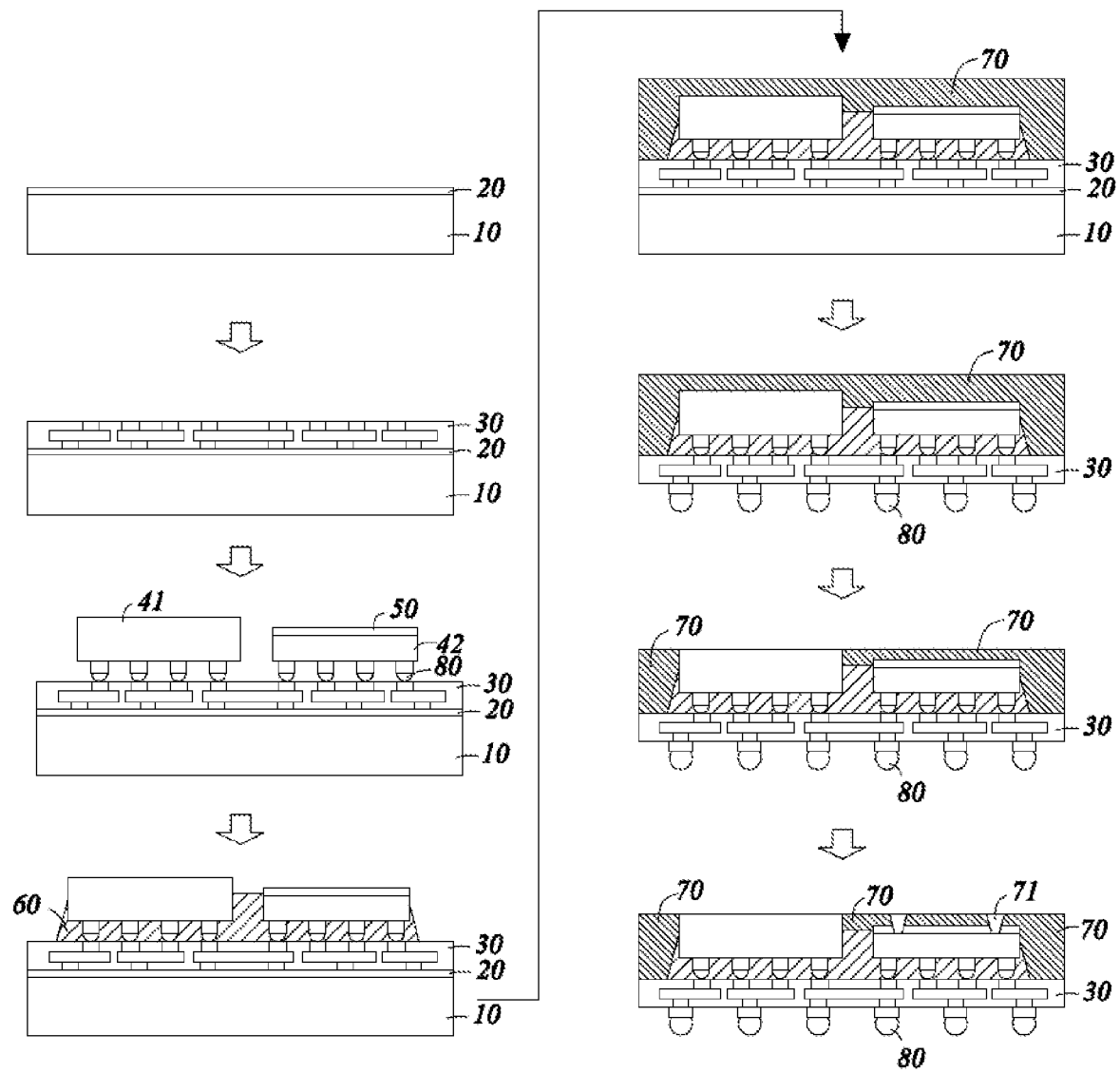
FIG. 8 is a schematic diagram of steps corresponding to the package method shown in FIG. 7 according to the present invention.

As shown in FIG. 7 and FIG. 8, a package method of the fan-out package structure shown in FIG. 5 is provided according to an embodiment of the present invention. The package method includes the following steps.

In step S1, a carrier board 10 is provided, and a single-layer or multi-layer temporary bonding protective layer 20 is coated on an upper surface of the carrier board 10. The temporary bonding protective layer 20 is used to protect a redistribution layer 30 disposed thereabove. The temporary bonding protective layer 20 may be a polymer layer or a band-shaped adhesive layer, and two sides of the temporary bonding protective layer 20 are often provided with an adhesive tape, or an adhesive glue made by a spin coating process. The adhesive tape may be, for example, a chip attached film or a non-conductive film. The adhesive glue may be, for example, an ultraviolet (UV) tape easily torn off upon irradiation of UV light, and epoxy resin, silicone rubber, polyimide (PI), polybenzoxazole (PBO), benzocyclobutene (BCB) and the like that can be removed by methods such as wet etching and chemical mechanical polishing.

It is to be noted that, the temporary bonding protective layer 20 in step S1 may be selectively arranged, that is, the redistribution layer 30 may be directly arranged on the carrier board 10 provided in step S1, which is not described in further detail herein.

In step S2, the redistribution layer 30 is arranged above the temporary bonding protective layer 20, wherein the redistribution layer 30 is formed by multi-wiring stacks, and may be a wafer-level or board-level redistribution stack layer, or an organic multi-wiring substrate.

In step S3, the high-heat chip 41 and the low-heat chip 42 are installed on the redistribution layer 30 in a flipped manner. In this step, for the low-heat chip 42, the polymer dielectric layer 43 is arranged on the lower surface of the low-heat chip 42 and/or the warpage adjusting and protective layer 50 is arranged on the upper surface of the low-heat chip 42 before step S3 if necessary. Further, the high-heat chip 41 and the low-heat chip 42 are packaged into one piece, and then installed on the redistribution layer 30 in a flipped manner in step S4.

In step S4, the underfill layer 60 is formed above the redistribution layer 30 by performing underfill on the high-heat chip 41 and/or the low-heat chip 42. The underfill layer 60 may only coat metal bumps 80 with solder caps below the chips, or extend upward to the side walls of the chips, or extend to be flush with the upper surface of the low-heat chip 42, or extend to be flush with the upper surface of the high-heat chip 41. In the specific embodiment, the underfill layer 60 extends to be flush with the upper surface of the low-heat chip 41.

It is to be noted that, step S5 is an option. That is, step S6 may be directly performed after step S4.

In step S5, plastic packaging is performed above the redistribution layer by using a plastic package material 70, and the both chips are embedded in the plastic package material 70. In this step, the chips may be both protected by plastic-packaging or printing/attaching a polymer composite material.

In step S6, the temporary bonding protective layer 20 and the carrier board which are below the redistribution layer 30 are removed, and the metal bumps 80 with the solder caps are formed below the redistribution layer 30. The manner for removing the temporary bonding protective layer 20 and the carrier board may be selected according to the material of the disposed temporary bonding protective layer 20, which is not described in further detail herein.

In step S7, back thinning is performed to expose the upper surface of the high-heat chip 41 outside the plastic package material 70, the upper surface of the high-heat chip 41 being the upper surface of the entire fan-out package structure.

In step S8, a through hole 71 is formed at a preset position above the low-heat chip 42 to expose part of the upper surface of the low-heat chip 42 outside the plastic package material 70 through the through hole 71, so as to form a final fan-out package structure. For example, the hole may be formed by UV laser, which is not described in further detail herein.

In summary, in the fan-out package structure of the present invention, by disposing the warpage adjusting and protective layer on the upper surface of the low-heat chip or by forming the at least one through hole 71 in the plastic package material above the low-heat chip, the warpage adjustment capability of the entire fan-out package structure is enhanced, and the yield and the stability of the fan-out package structure are both greatly improved.

It should be understood that although the present invention is described in terms of the embodiments in this description, not every embodiment includes only one independent technical solution. The statement mode of the description is merely for clarity, and those skilled in the art should regard the description as a whole, where the technical solutions in various embodiments may also be combined properly to develop other embodiments understandable by those skilled in the art.

The series of detailed illustration listed above are merely for specifically illustrating the available embodiments of the present invention, but not intended to limit the protection scope of the present invention. Any equivalent embodiments or variations made without departing from the technical spirit of the present invention shall fall within the protection scope of the present invention.

What is claimed is:

1. A fan-out package structure, comprising:
   a redistribution layer,
   a solder ball disposed below the redistribution layer,
   a high-heat chip and a low-heat chip that are electrically connected above the redistribution layer, and
   a plastic package material disposed above the redistribution layer in a filling manner and coating the high-heat chip and the low-heat chip, an upper surface of the high-heat chip being exposed outside the plastic package material, and an upper surface of the low-heat chip being encapsulated in the plastic package material;
   wherein
   at least one through hole is formed in the plastic package material right above the low-heat chip, and part of the upper surface of the low-heat chip is exposed outside the plastic package material through the through hole, and wherein the fan-out package structure further comprises:
a warpage adjusting and protective layer disposed on the upper surface of the low-heat chip, the through hole penetrating through the warpage adjusting and protective layer.

2. The fan-out package structure according to claim 1, wherein a groove is formed downward from an upper surface of the plastic package material where the low-heat chip is close to the high-heat chip, the groove is not connected to an adjacent chip, and a bottom of the groove is not lower than the upper surface of the low-heat chip; and the adjacent chip comprises a high-heat chip and/or a low-heat chip.

3. The fan-out package structure according to claim 1, wherein an opening size of the through hole remains unchanged or gradually decreases in an extension direction from the upper surface of the plastic package material to the low-heat chip.

4. The fan-out package structure according to claim 1, wherein at least one through hole is disposed in a long strip shape along an edge of the low-heat chip close to the high-heat chip, and/or at least two through holes are arranged in a long strip shape along the edge of the low-heat chip close to the high-heat chip.

5. The fan-out package structure according to claim 1, wherein the high-heat chip and the low-heat chip are both electrically connected to the redistribution layer through the solder ball.

6. The fan-out package structure according to claim 1, further comprising: an underfill layer coated with the plastic package material and disposed above the redistribution layer in a filling manner, wherein the underfill layer coats ends/an end of sides/a side of the high-heat chip and/or the low-heat chip that are/is close to the redistribution layer.

7. The fan-out package structure according to claim 6, wherein the underfill layer further coats side walls/a side wall of the high-heat chip and/or the low-heat chip.

8. The fan-out package structure according to claim 1, further comprising: at least one polymer dielectric layer attached to a lower surface of the low-heat chip.

9. The fan-out package structure according to claim 1, wherein the warpage adjusting and protective layer has a thickness being greater than or equal to 10 μm and a thermal expansion coefficient being greater than 10 ppm/K.

* * * * *